(12) United States Patent
Nistler et al.

(10) Patent No.: US 7,683,622 B2
(45) Date of Patent: Mar. 23, 2010

(54) RADIO-FREQUENCY TRANSMISSION ARRANGEMENT FOR A MAGNETIC RESONANCE SYSTEM

(75) Inventors: Juergen Nistler, Erlangen (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 156 days.

(21) Appl. No.: 11/863,542

(22) Filed: Sep. 28, 2007

(65) Prior Publication Data

US 2008/0079430 A1    Apr. 3, 2008

(30) Foreign Application Priority Data

Sep. 28, 2006    (DE) ................. 10 2006 046 044

(51) Int. Cl.
*G01V 3/00* (2006.01)
(52) U.S. Cl. ...................... 324/318; 324/319
(58) Field of Classification Search ......... 324/300–322; 600/407–435
See application file for complete search history.

(56) References Cited

U.S. PATENT DOCUMENTS

| | | | | |
|---|---|---|---|---|
| 2,994,808 A | * | 8/1961 | Kolm | ........................ 335/300 |
| 4,680,549 A | | 7/1987 | Tanttu | ....................... 324/318 |
| 5,197,474 A | * | 3/1993 | Englund et al. | ............. 600/415 |
| 5,453,692 A | * | 9/1995 | Takahashi et al. | ........... 324/318 |
| 5,952,830 A | * | 9/1999 | Petropoulos et al. | ........ 324/318 |
| 6,037,773 A | * | 3/2000 | Mitsumata et al. | .......... 324/318 |
| 6,529,004 B1 | * | 3/2003 | Young | ........................ 324/318 |
| 6,693,428 B2 | * | 2/2004 | Udo et al. | ................... 324/318 |
| 7,161,353 B2 | * | 1/2007 | Schaaf et al. | ............... 324/318 |
| 7,183,770 B2 | * | 2/2007 | Gräßlin et al. | .............. 324/322 |
| 7,221,162 B2 | | 5/2007 | Feiweier et al. | ............. 324/318 |
| 7,330,030 B2 | * | 2/2008 | Nakabayashi | ............... 324/318 |
| 7,391,213 B2 | * | 6/2008 | Watkins et al. | .............. 324/318 |
| 7,446,531 B2 | * | 11/2008 | Schnell et al. | .............. 324/318 |
| 2002/0138001 A1 | * | 9/2002 | Kroeckel | ..................... 600/410 |
| 2003/0076102 A1 | * | 4/2003 | Udo et al. | ................... 324/318 |
| 2004/0220468 A1 | * | 11/2004 | Watkins et al. | .............. 600/410 |
| 2005/0122108 A1 | * | 6/2005 | Yasuhara et al. | ............ 324/318 |
| 2005/0140369 A1 | * | 6/2005 | Feiweier et al. | ............. 324/318 |
| 2005/0242814 A1 | * | 11/2005 | Schaaf et al. | ............... 324/318 |
| 2006/0054810 A1 | * | 3/2006 | Grasslin et al. | ............. 250/299 |
| 2007/0096739 A1 | * | 5/2007 | Nakabayashi | ............... 324/318 |
| 2008/0079430 A1 | * | 4/2008 | Nistler et al. | ............... 324/318 |
| 2008/0129293 A1 | * | 6/2008 | Schnell et al. | .............. 324/318 |

FOREIGN PATENT DOCUMENTS

| DE | 42 38 831 A1 | 5/1994 |
|---|---|---|
| DE | 101 09 489 A1 | 10/2001 |

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

A radio-frequency transmission arrangement for an MR system for generation of a total B1 field which has a first antenna device that generates a first portion of the total B1 field and at least one antenna insert that generates a second portion of the total B1 field, such that the resulting B1 field is generated by the first antenna device and the at least one antenna insert.

13 Claims, 2 Drawing Sheets

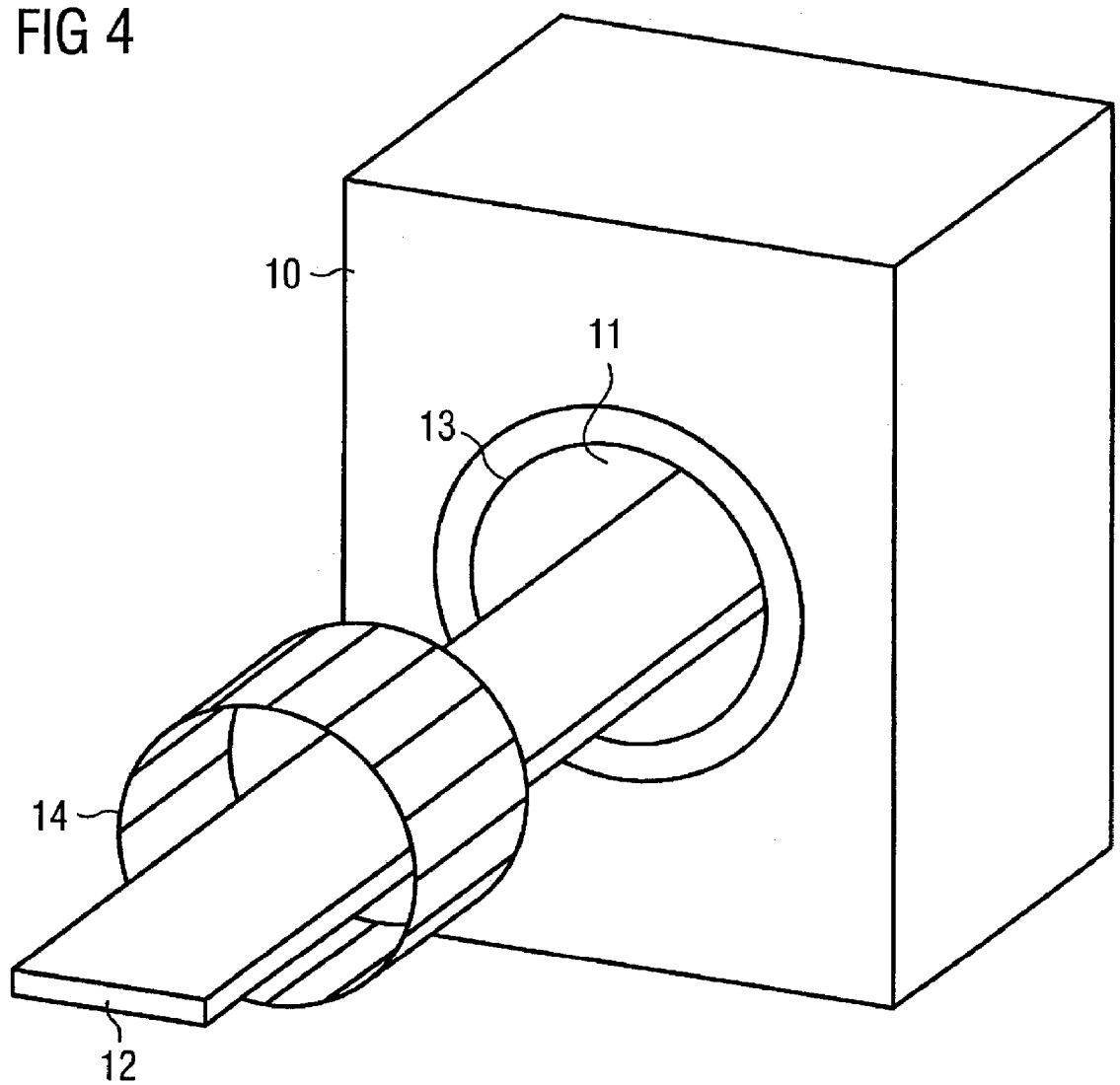

RADIO-FREQUENCY TRANSMISSION ARRANGEMENT FOR A MAGNETIC RESONANCE SYSTEM

BACKGROUND OF THE INVENTION

1. Field of the Invention

The present invention concerns a radio-frequency transmission arrangement for a magnetic resonance system for generation of a B1 field.

2. Description of the Prior Art

Using magnetic resonance tomography it is possible to generate slice images of the human body in arbitrary planes by selected excitation of the magnetization of nuclear spins in examination subject located in an optimally homogeneous, static basic magnetic field (also designated as a B0 field). To excite the magnetization resulting from the nuclear spins, radio-frequency pulses are radiated into the examination subject with radio-frequency antenna. The electromagnetic flux density of these radio-frequency pulses is typically designated as a B1 field. Usually the specification of the radio-frequency pulses necessary for magnetic resonance excitation is provided digitally by control electronics as a sequence of complex numbers. These are supplied from a modulator and an RF power amplifier to a transmission antenna.

Conventional magnetic resonance systems have only one whole-body antenna that should generate an optimally homogeneous B1 field. Since the tissue of the person examined in the MR system is conductive, the induced currents alter the inherently homogeneous B1 field distribution. Temporal and spatial fluctuations in the field strength of the excited B1 field lead to changes in the acquired MR signal, which leads to unwanted changes of the image intensity in the shown MR image. For example, an inhomogeneous spatial distribution of the amplitudes of the B1 field leads to an unwanted dependency of the image contrast on the spatial position of the signal sources (excited nuclei). For this reason transmission systems with a number of channels are desirable, which respectively exhibit different field distributions, such that an essentially homogeneous B1 field can be generated by superimposition of the various fields. DE 10 2004 053 777 A1 describes such a transmission arrangement with a number of channels.

Furthermore, new acquisition techniques have been developed with which different B1 field profiles that are generated by a number of antennas are used simultaneously. For this reason it is desirable to use a radio-frequency transmission arrangement that can generate various field distributions. In conventional magnetic resonance systems only one whole-body antenna is typically installed that can generate only one (preferably homogeneous) field distribution. So that users of systems with installed whole-body antennas can make use of applications with a number of transmission channels, radio-frequency transmission arrangements would thus have to be retrofitted with a number of channels. This is very costly and time-intensive.

SUMMARY OF THE INVENTION

An object of the present invention is to provide a radio-frequency transmission arrangement with which different field distributions or, respectively, modes can be generated in a simple manner.

This object is achieved in accordance with the invention by a radio-frequency transmission arrangement that generates a B1 field in an MR system that has a first antenna device that generates a first portion of the total B1 field. An antenna insert is provided that generates the second portion of the total B1 field, such that the total B1 field is generated by the first antenna device and the at least one antenna insert. In a preferred embodiment the first antenna is the whole-body antenna integrated into the magnetic resonance system. According to the present invention, the whole-body antenna already installed into the MR system can be a part of a multi-channel transmission antenna. This antenna device can be a single-channel antenna.

In an embodiment of the invention, the radio-frequency arrangement can generate N modes (N>1). The whole-body antenna can hereby generate a basic mode, and the antenna insert can generate the remaining N−1 modes. As used herein, the term "mode" is a spatial magnetic field distribution of a magnetic field radiated with an antenna unit, this magnetic field distribution being determined by the amplitude and phase of the magnetic field at every location in the transmission volume. Each mode thus has a different spatial field distribution. The basic mode radiated by the whole-body antenna can be, for example, an essentially homogeneous field distribution with a uniform polarization.

The electromagnetic field radiated by the whole-body antenna and the electromagnetic field radiated by the antenna insert preferably have the same frequency. The generated modes are circularly-polarized. While the radiated basic mode can exhibit an essentially homogeneous field distribution, the field distribution of the higher, different modes is advantageously not homogeneous. This inhomogeneity of the higher modes is desirable and necessary for usage in a multi-channel transmission system.

According to a preferred embodiment of the invention, the mode generated by the whole-body antenna is orthogonal to the modes generated by the antenna insert. If a number of radio-frequency transmission arrangements are used in spatial proximity to one another, the problem can occur that they inductively couple with one another, such that they radiate at undesirably high energy. Given the use of orthogonal modes, this problem is largely remedied. There is almost no coupling between the whole-body antenna and the antenna insert. The use of orthogonal modes is described in more detail in the DE 10 2004 053 777 A1. The disclosure is incorporated herein as to the provision of such orthogonal modes.

The field sectors of the antenna insert and the whole-body antenna do not necessarily have to be perpendicular to one another. Rather, the term "orthogonal modes" means that the field patterns produced thereby do not couple with one another.

An advantage of the use of orthogonal modes is also that possible routine calibration tasks can be omitted in the installation of the antenna insert. These calibration tasks would be necessary in order to reduce interaction between the two transmission arrangements upon installation of the antenna insert and given use of the already-present whole-body antenna.

According to a further embodiment, the antenna insert can also be detachably coupled with the MR system and not be permanently installed in the MR system. Given a detachable fixing of the antenna insert, this can be, for example, detachably connected with the patient bed. In this embodiment the antenna insert would then be moved into the MR system with the patient bed. This detachable connection with the patient bed is possible when orthogonal modes are used as explained previously, since in this case a matching of the individual transmission devices to one another is not necessary, such that the antenna insert can simply be inserted into the MR system without causing an amplified interaction of the whole-body antenna with the antenna insert.

According to a further embodiment of the invention, the antenna insert exhibits a feed line for each mode, each feed line supplying the antenna insert with the necessary RF pulse.

According to a further aspect of the invention, a method is provided for generation of a resulting B1 field of a magnetic resonance system by a radio-frequency transmission arrangement with a number of channels, with a first portion of the B1 field being generated by the single-channel whole-body antenna of the magnetic resonance system. A further second portion of the B1 field is generated by the antenna insert, such that the resulting B1 field is generated by the whole-body antenna and the antenna feed. As mentioned above, it is advantageous when the portion of the B1 field to be generated by the whole-body antenna orthogonally to the second portion of the B1 field generated by the antenna insert.

BRIEF DESCRIPTION OF THE DRAWINGS

FIG. 4 is a perspective view of an MR system, wherein the antenna insert is moved with the patient bed.

DESCRIPTION OF THE PREFERRED EMBODIMENTS

Figure 1:
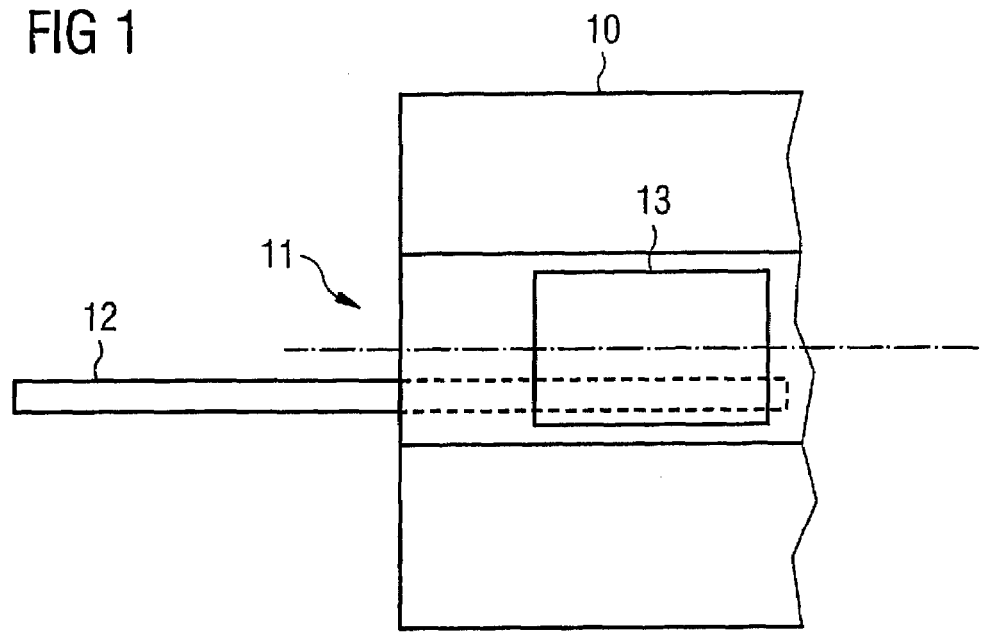
FIG. 1 shows a schematic cross-section through an MR system with an integrated whole-body antenna.
Figure 2:
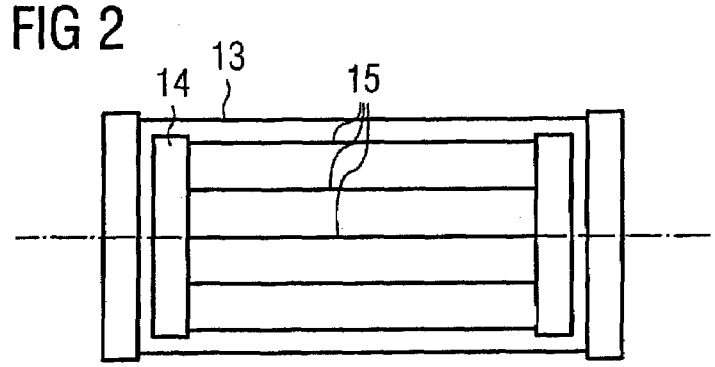
FIG. 2 shows a whole-body antenna with antenna insert located therein in a side view.

Schematically shown in FIG. 1 is a MR system 10 in a cross-section. As generally known, this MR system 10 has an opening 11 into which a patient table 12 with an examination person (not shown) lying thereon can be inserted. The functionality of the MR system is generally known and need not be explained in detail herein. Furthermore, in FIG. 1 a whole-body antenna 13 that is permanently integrated into the MR system, that generates a homogeneous B1 field in the examination subject to excite magnetization of the nuclear spins. In the present context, the term "whole-body antenna" means an antenna of the type typically installed in an MR system. This whole-body antenna can generate a homogeneous field distribution. If a multi-channel transmission arrangement should be generated in the MR system shown in FIG. 1, this whole-body antenna 13 would have to be exchanged. However, according to the invention it is possible to use this whole-body antenna 13 (which is also shown in FIG. 2) together with an antenna insert 14 shown in FIG. 2. This antenna insert has a number of individually controllable antenna elements 15. In the exemplary embodiment the antenna insert is shown in a known as a birdcage resonator that, for example, has eight antenna elements 15 that are arranged parallel to one another around a symmetry axis and enclose a transmission volume. Naturally the antenna insert 14 can also have more or fewer antenna elements 15. Various modes or field curves can be generated by the antenna insert by the activation of the individual antenna elements with specific amplitudes and phases of a B1 field. The whole-body antenna 13 can likewise be fashioned as a birdcage resonator.

According to a preferred embodiment of the invention, the B1 field that is generated by the whole-body antenna 13 is orthogonal to the portion of the B1 field that is generated by the antenna elements 15, such that coupling between the two antenna parts 13 and 14 is largely avoided.

Figure 3:
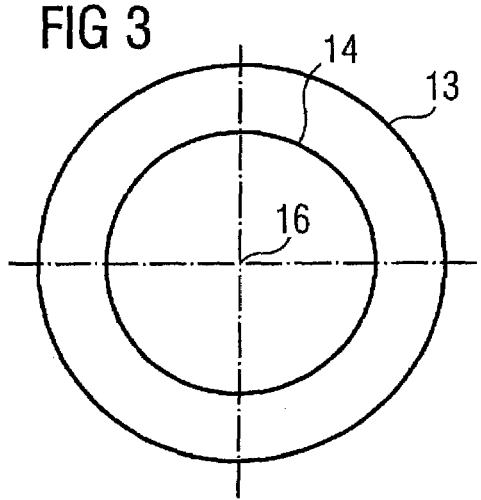
FIG. 3 is a front view of a radio-frequency transmission arrangement including a whole-body antenna and antenna insert.

The two portions of the radio-frequency transmission arrangement are shown in a front view in FIG. 3, wherein it can be seen that both antenna portions (the whole-body antenna 13 and the antenna insert 14) are arranged concentrically relative to the examination center 16. For example, the antenna insert 14 and the whole-body antenna 13 can now be used such that an optimally homogeneous B1 field is generated in the region within the transmission arrangement even in the presence of an examination person. For example, for this purpose the antenna insert 14 can be controlled such that the total B1 field inhomogeneities resulting from the whole-body antenna in the examination region are optimally compensated by the B1 fields generated by the elements 15. The generation of an optimally homogeneous B1 field distribution using a multi-mode antenna is described, for example, in the aforementioned DE 10 2004 777 A1.

In an embodiment the antenna insert has a feed channel for each antenna element 15. Respective amplifiers (not shown) feed the amplitude and phase values into the individual feed channels.

In another embodiment, only the whole-body antenna has an RF amplifier, and the antenna insert 14 is inductively coupled to the antenna elements 15 of the insert 14. In this case the whole-body antenna would have to be controlled such that the antenna insert 14 is excited by the B1 field generated by the whole-body antenna. The antenna insert 14 in turn radiates a further B1 field portion, such that overall an optimally homogeneous resulting B1 field is generated. In this case the modes generated by both antenna portions would then be non-orthogonal since a coupling between whole-body antenna 13 and antenna insert 14 is desired.

In an embodiment of the invention, the antenna insert can be permanently integrated into the MR system.

As shown in FIG. 4, however, the antenna insert 14 need not be permanently integrated into the MR system 10. When both parts of the antenna are decoupled via use of orthogonal modes, the antenna insert 14 can also be movably coupled with the MR system. For example, the antenna insert 14 can be affixed into the opening 11 of the MR system 10 in the form of an insert that is affixed on the patient bed 12. When a patient (not shown) is moved with the patient bed into the magnet center, an MR system that has only one whole-body antenna 13 can be used in a simple manner as a multi-channel radio-frequency transmission arrangement without elaborate installation measures being necessary for this.

With the example shown in FIG. 4 it is possible to use an antenna insert that is simply slid into the basic magnetic field dependent on the necessity of a multi-channel transmission arrangement. A time-consuming decoupling of the two antennas can be foregone when the two antennas use orthogonal modes. As the present application shows, a whole-body antenna already installed in an MR system can form one part of a multi-channel transmission arrangement, with the further channels being added by the antenna insert. The replacement of the existing antenna with a specially-designed multi-channel antenna is not necessary, which makes the upgrading of an MR system to a system with a multi-channel transmission arrangement significantly cheaper.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency transmission arrangement configured for a magnetic resonance system, comprising:

a first antenna device that generates a first portion of an RF total B1 field;

at least one antenna insert that generates a second portion of the RF total B1 field, said total B1 field being generated by said first antenna device and said at least one antenna insert operating simultaneously in combination therewith;

said first antenna device and said at least one antenna insert being concentric relative to each other; and said first antenna device and said at least one antenna insert respectively being configured to generate said first and second portions of said total B1 field in N different field distribution modes; and said first antenna device being configured to generate said first portion of the total B1 field as a basic mode and said at least one antenna insert being configured to generate the second portion of the total B1 field in each of the remaining N−1 field distribution modes other than said basic mode of the first antenna device.

2. A radio-frequency transmission arrangement as claimed in claim 1 wherein said magnetic resonance system comprises a magnetic resonance scanner configured for interaction with an examination subject, and wherein said first antenna is a whole-body antenna integrated into said magnetic resonance scanner.

3. A radio-frequency transmission arrangement as claimed in claim 1 wherein said magnetic resonance system comprises at least one component configured to interact with an examination subject, and wherein said antenna insert is permanently integrated into said at least one component.

4. A radio-frequency transmission arrangement as claimed in claim 1 wherein said magnetic resonance system comprises at least one component configured to interact with an examination subject, and wherein said antenna insert is detachably coupled to said at least one component.

5. A radio-frequency transmission arrangement as claimed in claim 4 wherein said at least one component is a movable patient bed, and wherein said antenna insert is detachably connected to, and co-movable with, the movable patient bed.

6. A radio-frequency transmission arrangement as claimed in claim 1 wherein said first antenna device is configured to generate said basic mode as a mode that is orthogonal to the N−1 modes generated by said at least one antenna insert.

7. A radio-frequency transmission arrangement as claimed in claim 1 wherein said basic mode generated by said first antenna device and the N−1 modes generated by said at least one antenna insert are circularly polarized.

8. A radio-frequency transmission arrangement as claimed in claim 1 comprising N−1 feed lines connected to said antenna insert that respectively supply signals to said antenna insert to generate the N−1 modes.

9. A radio-frequency transmission arrangement as claimed in claim 1 wherein said first antenna device generates said first portion of the total B1 field at a same frequency as the second portion of the total B1 field generated by said at least one antenna insert.

10. A radio-frequency transmission arrangement as claimed in claim 1 wherein said first antenna device is configured to generate said first portion of the total B1 field with a homogenous field distribution, and wherein said at least one antenna insert is configured to generate said second portion of the total B1 field with a non-homogenous field distribution.

11. A method for generating a radiofrequency B1 field in a magnetic resonance system comprising the steps of:

generating a first portion of a total B1 field in a magnetic resonance system with a whole-body antenna of the magnetic resonance system; and generating a second portion of the total B1 field in the magnetic resonance system with an antenna insert that is physically separate from and concentric to said whole-body antenna, with the total B1 field being generated by combined simultaneous operation of the whole body antenna and the antenna insert;

generating said first and second portions of said total B1 field in N different field distribution modes with said first antenna and said at least one antenna insert, respectively; and generating said first portion of said total B1 field with said first antenna device as a basic mode, and generating said second portion of said total B1 field with said at least one antenna insert in each of the remaining N−1 field distribution modes other than said basic mode of the first antenna device.

12. A method as claimed in claim 11 comprising generating the first portion of the total B1 field with the whole body antenna orthogonally to the second portion of the total B1 field generated by the antenna insert.

13. A method as claimed in claim 11 comprising generating the second portion of the total B1 field with the antenna insert by inductive coupling of the antenna insert with the whole body antenna.

* * * * *